United States Patent [19]
Nguyen et al.

[11] Patent Number: 5,828,233
[45] Date of Patent: Oct. 27, 1998

[54] MIXED MODE CMOS INPUT BUFFER WITH BUS HOLD

[75] Inventors: Hung T. Nguyen, Santa Clara; Leo Lee, San Jose, both of Calif.

[73] Assignee: Quality Semiconductor, Inc., Santa Clara, Calif.

[21] Appl. No.: 710,280

[22] Filed: Sep. 12, 1996

[51] Int. Cl.$^6$ ...................... H03K 19/0175; H03K 19/23
[52] U.S. Cl. .................. 326/86; 326/30; 326/33; 326/21
[58] Field of Search .................. 326/21, 30, 33, 326/34, 58, 86

[56] References Cited

U.S. PATENT DOCUMENTS

| | | | |
|---|---|---|---|
| 4,857,764 | 8/1989 | Young | 326/86 |
| 5,027,008 | 6/1991 | Runaldue | 326/30 |
| 5,128,560 | 7/1992 | Chern et al. | 326/81 |
| 5,331,224 | 7/1994 | Ohannes et al. | |
| 5,386,153 | 1/1995 | Voss et al. | |
| 5,406,139 | 4/1995 | Sharpe-Geisler | |
| 5,444,397 | 8/1995 | Wong et al. | |
| 5,451,889 | 9/1995 | Heim et al. | |
| 5,455,520 | 10/1995 | Honda | 326/86 |
| 5,532,630 | 7/1996 | Waggoner et al. | |

FOREIGN PATENT DOCUMENTS 4-160921  6/1992  Japan .

*Primary Examiner*—Michael J. Tokar
*Assistant Examiner*—Richard Roseen
*Attorney, Agent, or Firm*—Pennie & Edmonds LLP

[57] ABSTRACT

A mixed-mode, overvoltage tolerant input buffer for interfacing to a tristate bus line is disclosed, the input buffer having a bus hold feature for maintaining the state of the input buffer output and bus line when the bus line enters into the tristate mode, the input buffer being capable of suppressing leakage currents from the bus input through the bus hold circuit to the input buffer power supply during overvoltage conditions. The bus hold circuit has a feedback inverter coupled between the output and the bus input for providing a stabilizing feedback signal to the bus input, the inverter being powered by a source voltage which is selectively coupled to the input buffer power supply, the source voltage being isolated from the input buffer power supply during overvoltage conditions.

19 Claims, 5 Drawing Sheets

MIXED MODE CMOS INPUT BUFFER WITH BUS HOLD

FIELD OF THE INVENTION

The present invention relates to the field of electronic circuits. In particular, the present invention relates to the field of CMOS input buffers for coupling an integrated circuit to a bus driven by tristate output buffer driver circuits.

BACKGROUND OF THE INVENTION

Conventional architectures for digital electronic systems, such as systems including data processing systems such as computers, as well as control systems, communications systems, and the like, communicate information between integrated circuit components by way of buses. Buses are transmission lines, generally configured as a metal line on a printed circuit board, but which may also be implemented as a conductive line within an integrated circuit chip, and to which various circuit functions are connected in such architectures. These circuit functions are capable of driving the bus with digital information, receiving digital information from the bus, or both, such digital information corresponding to data, address values, control signals, and the like.

FIG. 1 shows a portion of a conventional electronic system 100 relative to a single bus line 101. Electronic system 100 comprises circuits 102, 103, and 104, each having any of a variety of data processing functions or other electronic functions. For example, circuit 102 may be a microprocessor or a custom integrated circuit, while circuit 103 may be an SRAM. Circuits 102, 103, and 104 generally comprise I/O circuits 105, 106, and 107, respectively, for both driving the bus line 101 and receiving data from bus line 101. I/O circuits 105, 106, and 107 generally comprise tristate output buffers for driving the bus line 101, and receivers for receiving data from the bus line 101. Where one or more tristate output buffers are coupled to bus line 101, bus line 101 may be termed a tristate bus line.

Where multiple driver circuits such as those of FIG. 1 are connected to the same bus, the system must be controlled in such a manner as to prevent two or more I/O drivers from driving the bus with conflicting data states for significant periods of time. Conflicting data states on bus line 101 can result in excessive power dissipation and damage to the circuits 102, 103, or 104.

The tristate output buffers coupled to bus line 101 are capable of driving the bus line 101 in a drive mode and are capable of presenting, in a high impedance or tristate mode, a high impedance to the bus line 101 and allowing another circuit to drive the bus line 101. A conventional technique for ensuring that no two circuits simultaneously drive the bus line 101 with conflicting data states is to ensure that all tristate output buffers coupled to bus line 101 are in tristate mode before allowing any one of the tristate output buffers to enter into the drive mode.

Even though the above scheme avoids bus contention and conflict, and avoids the dissipation of current which can result from such conflict even for a short period of time, some problems can arise as a result. One problem is that when the bus line 101 is in tristate mode, i.e., when all tristate output drivers coupled to the bus line 101 are in tristate mode, bus line 101 can float to an indeterminate voltage due to the coupling of noise through unavoidable parasitic impedances and other causes. If the voltage to which bus line 101 floats is near the trip point of one or more receivers, significant current can be drawn through the receivers, and false switching can occur if the bus line 101 floats past a receiver trip point.

With reference to FIG. 1A, for circuit analysis purposes the above floating effect can be modelled by a parasitic circuit having one of two forms, depending on the driven state of the bus line 101 before tristate is entered. First, if the bus line 101 is driven to a high state, e.g. to 3.3 volts, and then enters into tristate mode, the parasitic circuit causing the floating effect on the bus line 101 can be modelled as including a resistor $R_{float}$ coupled between the bus line 101 and ground and a capacitance $C_{float}$ coupled between the bus line 101 and ground. The value $R_{float}$ is generally a very high resistance such as 1 Megohm. When the bus line enters tristate mode after being driven high, the voltage maintained by capacitor $C_{float}$ would slowly be drained away through resistor $R_{float}$.

Second, if the bus line 101 is driven to tristate after being driven to a low state such as ground, the parasitic circuit causing the floating effect may also include a voltage source V(stray) coupled between ground and a first node, and a resistor $R_{stray}$ coupled between the first node and the bus line 101. Although they may vary widely depending on the types of circuits coupled to the bus line 101, the values for $R_{float}$ and $R_{stray}$ are high, in the Megohm range. The value for $C_{float}$ depends on physical factors such as bus length and other factors. The voltage V(stray) as used in this model is used to model any of a variety of voltages arising from stray electromagnetic effects, imperfect output drivers, and other sources of stray voltages. V(stray) may be an oscillatory signal having a variety of frequencies, a slowly-varying dc signal, or both. When the bus line 101 is driven to zero and then released into the tristate mode, the voltage V(stray) may take on values which cause the capacitance $C_{float}$ to charge, thus causing the detrimental floating effect. It is noted that the model of FIG. 1A applies only when the bus line 101 is in tristate mode. When the bus line 101 is in drive mode, the bus line 101 is simply driven at a voltage source determined by the voltage of the driving circuit.

FIG. 1B shows what is perhaps the simplest form of input buffer, showing an input buffer 150 comprising an input DIN for coupling to a data bus line such as data bus line 101 of FIG. 1, an output DB, and a CMOS inverter I1 coupled between input DIN and output DB. As used herein, the term V(DIN) will be used to refer to the voltage at input DIN, the term V(DB) will be used to refer to the voltage at output DB, and so forth. It is further noted that, unless otherwise indicated, the term Vdd will refer to the supply voltage, the node or location at which the supply voltage is applied, or both. Inverter I1 comprises a p-channel pullup transistor P0 coupled between Vdd and the output DB, and an n-channel pulldown transistor N0 coupled between output DB and ground, the gates of transistors P0 and N0 both being coupled to input DIN. As described in Chirlian, ANALYSIS AND DESIGN OF INTEGRATED ELECTRONIC CIRCUITS (Harper & Row 1981) at pp. 113–119, the contents of which are incorporated herein by reference, it is desirable to drive inverter I1 with a rail-to-rail voltage, i.e. a voltage which is either 0.0 volts or at the supply voltage Vdd of the inverter I1. This prevents leakage current, denoted as Idd, from flowing from the supply voltage Vdd to ground through inverter I1. Depending on factors such as the size of inverter I1, process variances, environmental conditions, and other factors, when inverter I1 drives a simple resistive load and has a Vdd of 3.3 volts, the current Idd may exceed 8 milliamperes when V(DIN) floats to 1.65 volts, and may exceed 100 microamperes when V(DIN) floats to 2.3 volts. It is desired to minimize this undesired current Idd. Further, when V(DIN) floats to near 1.65 volts, the output voltage V(DB) may undesirably change states in an unstable manner. It is desired to stabilize the voltage V(DIN) by providing the input buffer with a hysteresis characteristic.

FIG. 1C shows an input buffer 180 which provides an input hysteresis characteristic, the input buffer 180 comprising an inverter I1 coupled between an input DIN and an output DB, a p-channel transistor P2 coupled between Vdd and output DB, and further comprising an inverter I2 coupled between output DB and the gate of transistor P2. As described in U.S. Pat. No. 5,386,153 entitled "BUFFER WITH PSEUDO-GROUND HYSTERESIS," the contents of which are incorporated herein by reference, the coupling of elements I2 and P2 as shown provides the input buffer 180 with an input hysteresis characteristic. For example, using a Vdd of 3.3 volts, the input buffer will drive V(DB) to high when V(DIN) is 0.0 volts. As V(DIN) rises, V(DB) will not switch over to low until V(DIN) rises above, for example, an upper switchover voltage of 1.80 volts. Further, when V(DIN) is 3.3 volts and is lowered, V(DB) will not switch over from low to high until V(DIN) is lowered below, for example, a lower switchover voltage of 1.50 volts. In this manner, the output V(DB) is stabilized when V(DIN) floats to an intermediate voltage near 0.5*Vdd. However, the input buffer 180 still suffers from excessive leakage current Idd when V(DIN) floats at intermediate voltages.

FIG. 2 illustrates a receiver or input buffer 200 having a bus-hold feature which is directed to resolving both the stability problem and the leakage current Idd problem. A similar circuit is described in U.S. Pat. No. 5,532,630 entitled "RECEIVER CIRCUIT WITH A BUS-KEEPER FEATURE," the contents of which are hereby incorporated by reference. Input buffer 200 comprises an input DIN for coupling to a data bus line such as data bus line 101 of FIG. 1, an output DB, and a CMOS inverter I1 coupled between input DIN and output DB. Input buffer 200 has an input hysteresis characteristic and, additionally, has a feedback feature for holding the data bus near ground or Vdd during tristate, as appropriate depending on the last driven state of the data bus, for minimizing the leakage current Idd. It is to be noted that while output DB is driven to the complement of input DIN, the input buffer 200 is nevertheless providing a buffered version of DIN to internal circuitry (not shown) coupled to output DB, the internal circuitry contained in circuits such as circuits 102, 103, and 104 of FIG. 1, it being understood that a data value D is readily available by simply inverting DB.

Input buffer 200 comprises a p-channel transistor P2 coupled between Vdd and output DB, and an inverter I2 coupled between output DB and the gate of p-channel transistor P2.

Input buffer 200 further comprises transistors P1 and N1 coupled to form a feedback inverter, denoted I3, between output DB and a node FB. Input buffer 200 further comprises a feedback resistor RBH coupled between node FB and input DIN. The feedback resistor RBH has a resistance which is typically much less than the parasitic resistance $R_{float}$, a typical value of RBH being about 8 Kohms.

Input buffer 200 provides an input hysteresis characteristic and bus holding characteristic when the bus line 101 connected to DIN goes from a drive mode into a floating mode. The input hysteresis characteristic is provided primarily by the elements P2 and I2 in a manner similar to the input buffer 180 of FIG. 1B. Regarding the bus hold characteristic, if V(DIN) is driven to Vdd and then the bus line 101 is released into a floating condition, the feedback inverter I3 will maintain V(DIN) at Vdd. A hold current will flow from node FB through resistor RBH to input DIN, and through the resistance $R_{float}$ to ground. This hold current, denoted $I_{hold}$ and having a direction as shown in FIG. 2, will be negative in this circumstance. Because RBH (about 8 Kohms) is much less than $R_{float}$ (in the Megohm range), the voltage V(DIN) will be maintained at substantially Vdd.

Conversely, if the bus line 101 were driven to ground and then released into a floating condition, the input buffer would maintain V(DIN) at ground despite the stray voltage source modelled by V(stray). In particular, the inverter I3 would maintain node FB at ground. Any fluctuations in V(stray) from zero will be filtered by the low pass filter formed by $R_{stray}$, $R_{float}$, and $C_{float}$, and quickly drained by the hold current $I_{hold}$ through resistor RBH. This is because RBH is generally small compared to $R_{stray}$, $R_{stray}$ being generally large (in the Megohm range) because the parasitic voltage sources modelled by V(stray) and $R_{stray}$ are generally weak. It is to be noted that the average value of the hold current $I_{hold}$ is zero in this circumstance.

A problem arises in the circuit of FIG. 2 in mixed voltage applications, which are becoming more and more common as CMOS memory and other devices are being designed for operation with 3.3 volt power supplies but require interconnection with TTL logic and other devices that operate at supply voltages of 5.0 volts. In particular, where Vdd for the input buffer 200 is 3.3 volts, if the bus line connected to input DIN is driven to 5.0 volts, a large amount of leakage current will flow from input DIN through resistor RBH and transistor P1 to the power supply Vdd, causing excessive power dissipation, heating, and even permanent circuit damage.

FIG. 3 shows an input buffer 300 similar to the circuit of FIG. 2 except having an n-channel transistor N2 in place of transistor P1 with its gate being driven by the complement of DB instead of DB. The N-channel transistor N2 acts as a pullup transistor for providing a feedback voltage to the input DIN, and avoids the large leakage current problem of the circuit of FIG. 2 in mixed-voltage applications. However, because the transistor N2 is an n-channel transistor, when the bus has been driven to Vdd and released, the voltage V(FB) will be Vdd−Vtn, wherein Vtn is the voltage drop of the n-channel transistor N2 and may be, for example, 0.7 volts to 1.0 volts, depending on factors such as size, process variances, environmental conditions, or other factors. Thus, for example, for a Vdd of 3.3 volts, the voltage V(FB) may be only 2.3 volts, and thus the voltage V(DIN) will only be maintained near 2.3 volts. As described previously with respect to FIGS. 1B and 1C, this results in an excessive leakage current Idd through the inverter I1, which is undesirable.

It is therefore an object of the present invention to provide an input buffer circuit which includes bus hold circuitry for controlling the voltage of a tristate bus line and a state of the input buffer when the tristate bus line enters the high impedance state.

It is another object of the present invention to provide an input buffer having bus hold circuitry which is capable of tolerating overvoltage conditions and suppressing leakage current when the bus is driven to a voltage higher than the supply voltage of the input buffer.

It is another object of the present invention to provide an input buffer having an input hysteresis characteristic for providing a stabilized output voltage despite fluctuations in the input voltage near an intermediate input voltage.

It is still another object of the present invention to provide an overvoltage tolerant input buffer having a hold feature which provides a full rail to rail feedback voltage to its input for increased circuit stability.

SUMMARY OF THE INVENTION

These and other objects of the present invention are provided for by a mixed-voltage input buffer with a bus hold feature, the input buffer operating at a supply voltage, the input buffer including a bus hold circuit which is powered by a source voltage selectively coupled to the supply voltage responsive to an input voltage. The bus hold circuit isolates the source voltage from the power supply during overvoltage conditions for preventing leakage current from the input to the supply voltage. The input buffer according to the present invention has an input, a reference node for receiving a reference voltage, a supply node for receiving a supply voltage, and a first inverter coupled between the input and the output, the bus hold circuit having a feedback inverter coupled between the output and the input. The feedback inverter has a pullup transistor having a source node, and the input buffer has a switch transistor for coupling the source node to the supply node, the switch transistor being turned off when the input voltage rises above a first voltage greater than the supply voltage for preventing leakage current.

In one embodiment, a resistive element is coupled between the feedback inverter and the input for appropriately restricting a hold current flowing between the feedback inverter and the input. In another embodiment, the switch transistor has a gate, and a p-channel transistor is provided between the output of the feedback inverter and the gate of the switch transistor, the p-channel transistor having a gate coupled to the supply voltage. A first n-channel transistor is coupled between the gate of the switch transistor and the reference node, the n-channel transistor having a gate coupled to the output. In another embodiment, a second n-channel transistor is coupled between the input and the gate of the switch transistor and has a gate coupled to the input, and a third n-channel transistor is coupled between the input and the gate of the switch transistor and has a gate coupled to the gate of the switch transistor, for appropriately driving the gate voltage of the switch transistor.

BRIEF DESCRIPTION OF THE DRAWINGS

The above mentioned objects and other objects, features, and advantages of the invention may be better understood by referring to the following detailed description, which should be read in conjunction with the accompanying drawings in which.

DETAILED DESCRIPTION OF THE INVENTION

Figure 1:
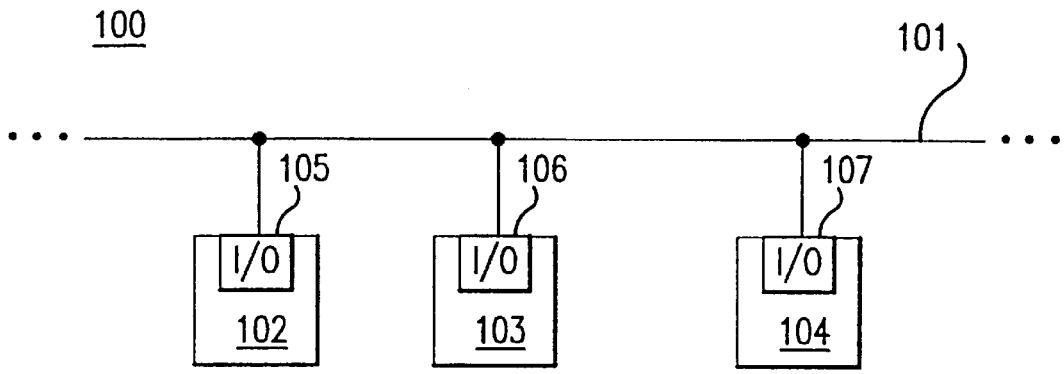
FIG. 1 illustrates a portion of a conventional electronic system relative to a single bus line.
Figure 1A:
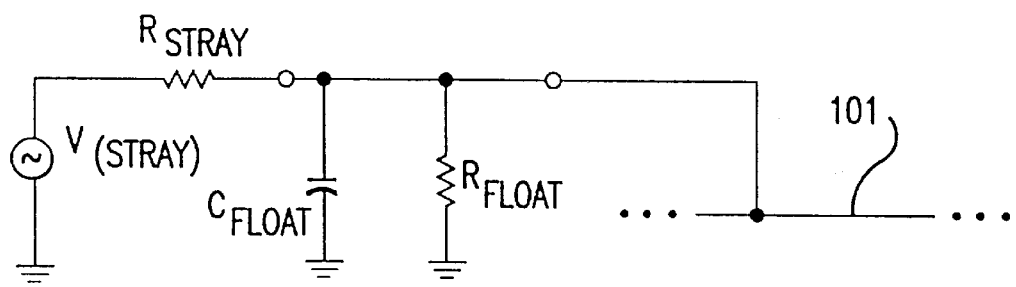
FIG. 1A illustrates one model for modelling parasitic resistances and capacitances and stray voltages associated with a bus line.
Figure 1B:
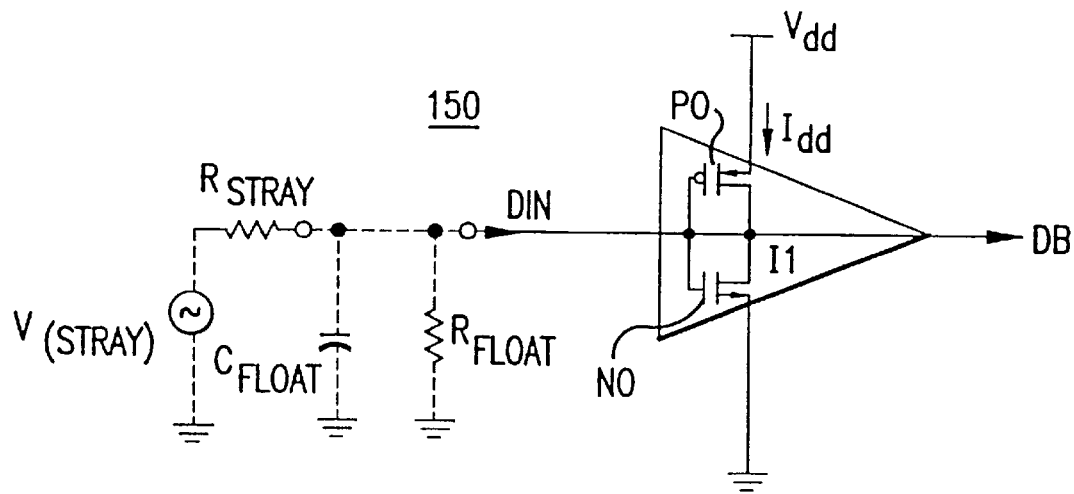
FIGS. 1B and 1C illustrate input buffers according to the prior art.
Figure 1C:
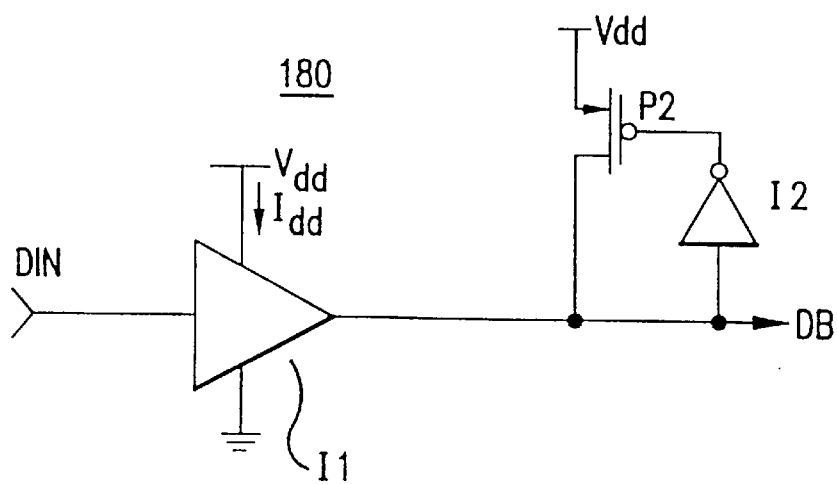
Figure 3:
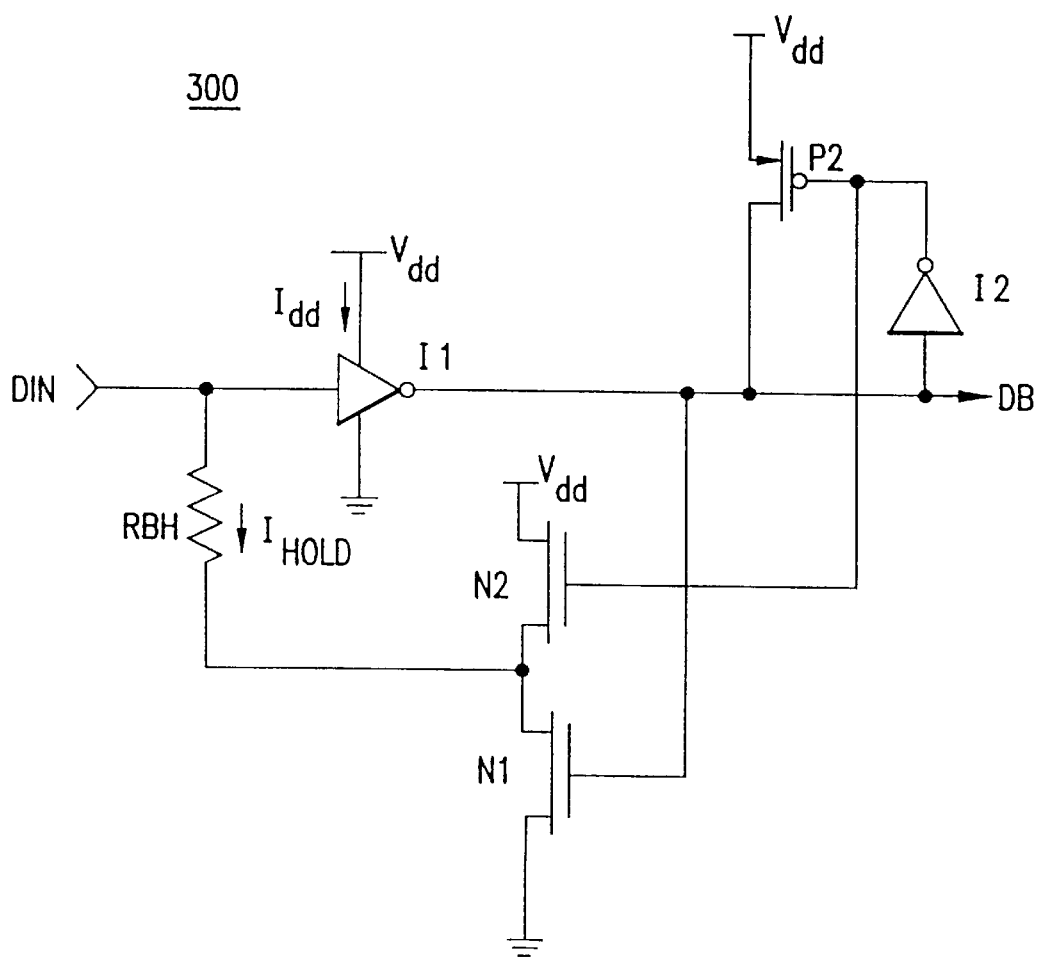
FIG. 3 illustrates an overvoltage tolerant input buffer having a bus hold feature.
Figure 4:
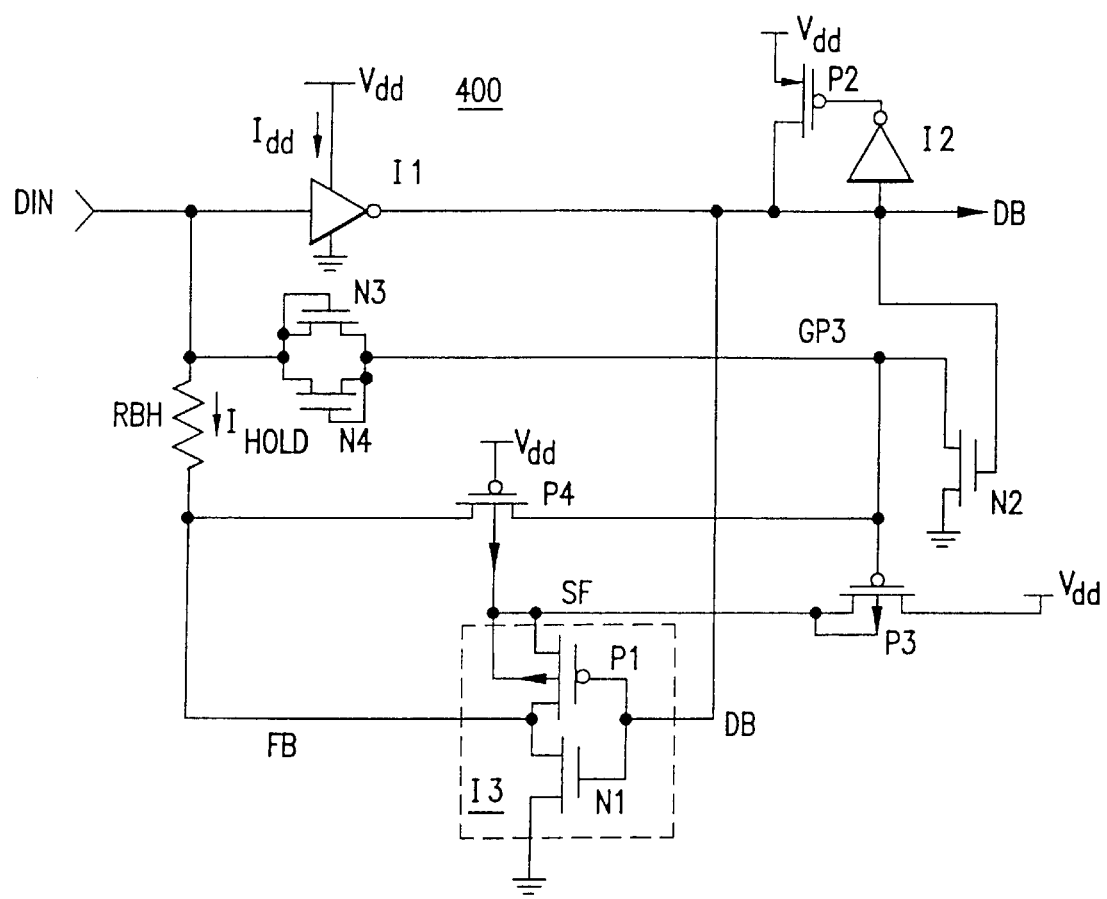
FIG. 4 illustrates a mixed-mode, overvoltage tolerant input buffer having a bus hold feature in accordance with the present invention.

FIG. 4 shows a mixed-mode, overvoltage tolerant input buffer 400 having a bus hold feature in accordance the present invention. Input buffer 400 comprises an inverter I1 coupled between an input DIN and an output DB. Input DIN is for coupling to a bus line such as bus line 101 of FIG. 1. Input buffer 400 further comprises an inverter I2 and a p-channel transistor P2 coupled as described previously with respect to the input buffers 200 and 300 of FIGS. 2 and 3, respectively. Input buffer 400 further comprises a bus hold circuit comprising a p-channel pullup transistor P1, an n-channel pulldown transistor N1, a p-channel switch transistor P3, a p-channel transistor P4, an n-channel pulldown transistor N2, n-channel transistors N3 and N4, and a feedback resistor RBH.

P-channel pullup transistor P1 and n-channel pulldown transistor N1 are coupled in a standard inverter configuration forming a feedback inverter I3 having an input at output DB and an output at a node FB, except that the feedback inverter I3 is powered by a voltage at a source node SF. Switch transistor P3 is coupled between node SF and Vdd, and has a gate coupled to node GP3. Thus, when node GP3 is low, source node SF will be coupled to Vdd, whereas when node GP3 is high, source node SF will be isolated from Vdd.

P-channel transistor P4 has a current channel coupled between the node FB and node GP3, has a backgate coupled to node SF, and has a gate coupled to Vdd. During drive mode, when V(FB) exceeds Vdd plus a p-channel threshold voltage Vtp, transistor P4 will cause the voltage at node GP3 to rise to substantially V(FB). Thus, switch transistor P3 will be turned off, isolating node SF from Vdd as desired. This isolation is desired in such a circumstance because if node SF remained coupled to Vdd, an unwanted reverse leakage current would flow from node FB through transistor P1 to Vdd, causing unwanted effects including possible harm to the circuit. The input buffer 400 is therefore tolerant to overvoltages at input DIN during drive mode.

N-channel transistor N2 is coupled between node GP3 and ground and is driven by V(DB). When V(DB) is high, i.e. when V(DIN) is low and reverse leakage currents through transistor P1 are not a threat, transistor N2 ensures the grounding of node GP3, thus turning on switch transistor P3 for coupling node SF to Vdd as desired.

N-channel transistors N3 and N4 are coupled between nodes DIN and GP3, as shown in FIG. 4. When V(DIN) goes to a high level but remains below Vdd plus Vtp, transistor N3 causes V(GP3) to be one n-channel threshold Vtn below V(DIN), allowing switch transistor P3 to increasingly isolate node SF from Vdd as V(DIN) rises, as desired. N-channel transistor N4, along with n-channel transistor N2, is used to discharge node GP3 when V(DIN) changes from high to low.

Figure 2:
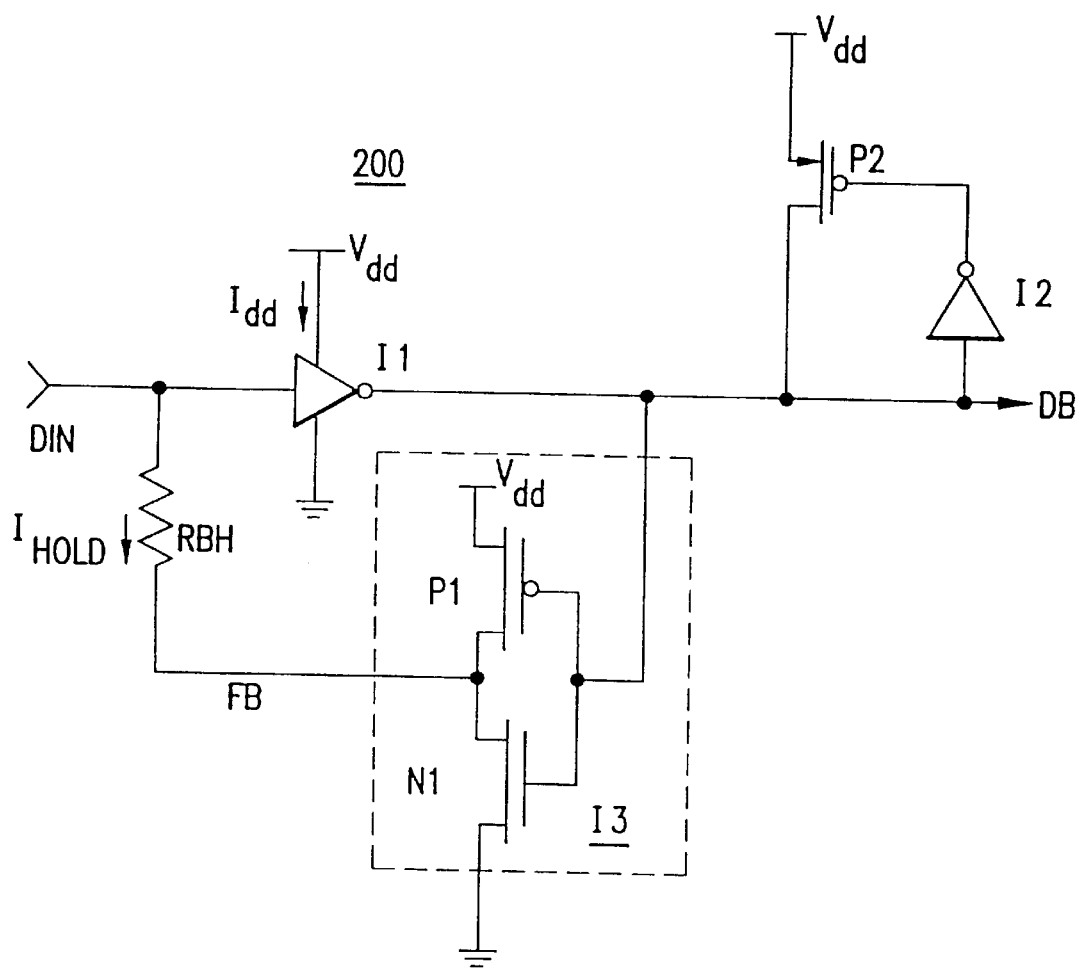
FIG. 2 illustrates an input buffer having a bus hold feature according to the prior art.

During drive mode, when V(DIN) is less than or equal to Vdd, the input/output characteristics of input buffer 400 are similar to those of the circuit of FIG. 2 with a bus hold feature and an input hysteresis feature. In particular, when V(DIN) is at zero volts, V(DB) is driven high and V(GP3) is driven low by n-channel transistor N2. In turn, node SF is coupled to Vdd, and V(FB) is driven low by feedback inverter I3, as desired. As V(DIN) increases beyond an upper switchover voltage, e.g. 1.80 volts where Vdd=3.3 volts, but is less than Vdd plus a threshold voltage Vtp, V(DB) is driven low and V(GP3) is driven to V(DIN) minus Vtn. Pullup transistor P1 turns on to couple node SF to node FB, and switch transistor P3 is either off or in a linear mode and represents a weaker coupling of node SF to Vdd. However, because V(DIN) does not exceed Vdd plus Vtp, there is no leakage current from input DIN to Vdd. As V(DIN) is lowered, the output V(DB) remains low until V(DIN) goes below a lower switchover voltage, for example 1.50 volts, and thus the input buffer 400 provides the desired stabilizing input hysteresis characteristic.

When the bus line 101 is in tristate mode, the input/output characteristics of input buffer 400 are also similar to those of the circuit of FIG. 2. In particular, a rail-to-rail feedback to node FB, for minimizing leakage current Idd through inverter I1 and stabilizing the output at output DB, is provided. When the bus line 101 enters tristate after a high state, V(FB) is driven to Vdd and a hold current through resistor RBH maintains V(DIN) at Vdd. When the bus line 101 enters tristate after a low state, V(FB) is driven to 0.0 volts, and any stray voltages V(stray) are quickly drained through resistor RBH to avert any significant variances of the voltage V(DIN). As a result, leakage current Idd through inverter I1 is minimized. In one embodiment of the invention the current Idd is typically kept below 1 microampere during tristate mode.

Thus, an input buffer according to the present invention provides the advantage that its bus hold features provide a full rail to rail feedback voltage for minimizing the leakage current Idd in the inverter I1. Further, an input buffer according to the present invention provides the further advantage that during overvoltage conditions when the V(DIN) exceeds the supply voltage Vdd, there is no leakage current from the input DIN to the input buffer supply voltage Vdd through the feedback inverter.

It is apparent that many modifications and variations of the present invention as set forth here may be made without departing from the spirit and scope thereof. By way of non-limiting example, an additional inverter may be added having an input at DB and an output at a node D for supplying a non-inverted, buffered version of V(DIN) to the internal circuitry would be within the scope of the present invention. The specific embodiments described here and above are given by way of example only and the invention is limited only by the terms of the appended claims.

What is claimed is:

1. A receiver circuit, comprising:
   a bus input for coupling to a bus;
   an output;
   a reference voltage input;
   a supply voltage input for receiving a supply voltage;
   an inverter coupled between said bus input and a first node, said output being driven responsive to a voltage at said first node; and
   a bus hold circuit coupled between said first node and said bus input, said bus hold circuit comprising:
      a p-channel pullup transistor having a first current node and a second current node, said first current node being coupled to a second node, said bus input being driven responsive to a voltage at said second current node when the bus is in a high impedance state, said pullup transistor being driven responsive to said voltage at said first node;
      a switch transistor coupled between said supply voltage input and said second node; and
      a switch transistor activation circuit coupled to said bus input, said supply voltage input, and said switch transistor for causing said switch transistor to couple said supply voltage input to said second node when said bus input is at a first voltage less than said supply voltage, and for causing said switch transistor to isolate said supply voltage input from said second node when said bus input is at a second voltage higher than said supply voltage;
   wherein leakage currents from said bus input to said supply voltage input through said bus hold circuit are suppressed when said bus input is driven to a voltage greater than said supply voltage.

2. The receiver circuit of claim 1, said pullup transistor having a gate, said receiver circuit further comprising a pulldown transistor having a first current node coupled to the second current node of said pullup transistor and having a gate coupled to the gate of said pullup transistor.

3. The receiver circuit of claim 2, further comprising a resistive element coupled between said second current node and said bus input, wherein said gate of said pullup transistor is coupled to said first node, and wherein said output is directly connected to said first node.

4. The receiver circuit of claim 3, said switch transistor having a gate, said receiver circuit further comprising a p-channel transistor coupled between said second current node and said gate of said switch transistor, said p-channel transistor having a gate coupled to a constant voltage.

5. The receiver circuit of claim 4, wherein said constant voltage is equal to said supply voltage.

6. The receiver circuit of claim 1, said first node being directly connected to said output, said receiver circuit further comprising:
   an inverter having an inverter input coupled to said output and having an inverter output;
   a p-channel transistor coupled between said supply voltage input and said output and having a gate coupled to said inverter output.

7. The receiver circuit of claim 5, further comprising a first n-channel transistor coupled between said gate of said switch transistor and said reference voltage input, said n-channel transistor having a gate coupled to said output.

8. The receiver circuit of claim 7, further comprising:
   a second n-channel transistor coupled between said bus input and said gate of said switch transistor and having a gate coupled to said bus input; and
   a third n-channel transistor coupled between said bus input and said gate of said switch transistor and having a gate coupled to said gate of said switch transistor.

9. In a receiver circuit for receiving a voltage from a bus, the bus for connecting to a plurality of systems, at least one of the systems having a drive mode and a high impedance mode, the bus floating when each of the systems is in the high impedance mode, the receiver circuit having a bus input for coupling to the bus and an output, the receiver being powered by a supply voltage provided at a supply voltage input and having a first inverter for driving the output between the supply voltage and a reference voltage responsive to a voltage at the bus input, a bus hold circuit comprising:
   a second inverter coupled between the output of the first inverter and a first node, the bus input being driven responsive to a voltage at said first node when the bus is floating, said second inverter being powered by a voltage at a second node, said second inverter comprising a p-channel pullup transistor coupled between said first node and said second node;
   a switch transistor coupled between said supply voltage input and said second node; and
   a switch transistor activation circuit coupled to said bus input, said supply voltage input, and said switch transistor for causing said switch transistor to couple said supply voltage input to said second node when said bus input is at a first voltage less than said supply voltage, and for causing said switch transistor to isolate said supply voltage input from said second node when said bus input is at a second voltage higher than said supply voltage;

wherein leakage currents from said bus input to said supply voltage input through said bus hold circuit are suppressed when said bus input is driven to a voltage greater than said supply voltage.

10. The bus hold circuit of claim 9, said second inverter having an input node coupled to said output of said first inverter.

11. The bus hold circuit of claim 10, further comprising a resistive element coupled between said first node and said bus input.

12. The bus hold circuit of claim 11, said switch transistor having a gate, said bus hold circuit further comprising a p-channel transistor coupled between said first node and said gate of said switch transistor, said p-channel transistor having a gate coupled to a constant voltage.

13. The bus hold circuit of claim 12, wherein said constant voltage is equal to said supply voltage.

14. The bus hold circuit of claim 13, further comprising a first n-channel transistor coupled between said gate of said switch transistor and said reference voltage input, said n-channel transistor having a gate coupled to said output.

15. The receiver circuit of claim 14, further comprising:
a second n-channel transistor coupled between said bus input and said gate of said switch transistor and having a gate coupled to said bus input; and
a third n-channel transistor coupled between said bus input and said gate of said switch transistor and having a gate coupled to said gate of said switch transistor.

16. A receiver circuit, comprising:
a bus input for coupling to a tristate bus;
an output;
a reference voltage input for receiving a reference voltage;
a supply voltage input for receiving a supply voltage;
a first inversion means coupled between said bus input and a first node, said output being driven responsive to a voltage at said first node; and
bus hold means coupled between said first node and said bus input, said bus hold means comprising:
a second inversion means coupled between said first node and a second node, said second inversion means comprising a pullup means having a source;
means for coupling said second node to said bus input; and
means for selectively coupling said source of said pullup means to said supply voltage input responsive to a voltage at said bus input supplied by said tristate bus when said tristate bus is in a drive mode, wherein said supply voltage input is isolated from said source when said voltage at said bus input is at a first voltage, and wherein said supply voltage input is coupled to said source when said voltage at said bus input is at a second voltage, said first voltage being greater than said supply voltage;
wherein leakage current from said bus input to said supply voltage input through said bus hold means is suppressed when said bus input is driven to a voltage greater than said supply voltage.

17. The receiver circuit of claim 16, said means for selectively coupling comprising:
a switch transistor coupled between said supply voltage input and said source node and having a gate;
a p-channel transistor coupled between said second node and said gate of said switch transistor and having a gate coupled to a constant voltage.

18. The bus hold circuit of claim 17, wherein said constant voltage is equal to said supply voltage.

19. In a receiver circuit for receiving a voltage from a bus, the bus for connecting to a plurality of systems, at least one of the systems having a drive mode and a high impedance mode, the bus floating when each of the systems is in the high impedance mode, the receiver circuit having a bus input for coupling to the bus and an output, the receiver being powered by a supply voltage and having a first inverter for driving the output between the supply voltage and a reference voltage responsive to a voltage at the bus input, a bus hold circuit comprising:
a second inverter having an input node coupled to the output of the first inverter and an output node coupled to a first node, the bus input being driven responsive to a voltage at said first node when the bus is floating, said second inverter being powered by a voltage at a second node;
a resistive element coupled between said first node and said bus input;
a switch transistor coupled between said supply voltage input and said second node for coupling said supply voltage input to said second node when said bus input is at a first voltage less than said supply voltage, and for isolating said supply voltage input from said second node when said bus input is at a second voltage higher than said supply voltage; and
a p-channel transistor coupled between said first node and a gate of said switch transistor, said p-channel transistor having a gate coupled to a constant voltage;
wherein leakage currents from said bus input to said supply voltage input through said bus hold circuit are suppressed when said bus input is driven to a voltage greater than said supply voltage.

* * * * *